(12) United States Patent
Taguchi

(10) Patent No.: US 6,707,144 B2
(45) Date of Patent: Mar. 16, 2004

(54) INSULATED HIGH SPEED SEMICONDUCTOR SWITCHING DEVICE

(75) Inventor: Kazunori Taguchi, Fukuoka (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/252,568

(22) Filed: Sep. 24, 2002

(65) Prior Publication Data

US 2003/0183841 A1 Oct. 2, 2003

(30) Foreign Application Priority Data

Mar. 28, 2002 (JP) .................................. 2002-091507

(51) Int. Cl.⁷ .................... H01L 23/48; H01L 23/04; H01L 23/053
(52) U.S. Cl. .................. 257/689; 257/688; 257/698; 257/700
(58) Field of Search ................... 257/365, 401, 257/688, 689, 698, 700

(56) References Cited

U.S. PATENT DOCUMENTS

| | | | |
|---|---|---|---|
| 4,719,500 A | | 1/1988 | Tokunoh |
| 4,835,119 A | | 5/1989 | Tokunoh |
| 5,866,944 A | * | 2/1999 | Hiyoshi et al. .............. 257/719 |
| 2001/0023984 A1 | * | 9/2001 | Fang et al. .................. 257/698 |

FOREIGN PATENT DOCUMENTS

| | | |
|---|---|---|
| JP | 60-53057 | 3/1985 |
| JP | 60-194565 | 10/1985 |
| JP | 62-76636 | 4/1987 |

* cited by examiner

Primary Examiner—Ngân V. Ngô
(74) Attorney, Agent, or Firm—Oblon, Spivak, McClelland, Maier & Neustadt, P.C.

(57) ABSTRACT

A semiconductor device has a semiconductor element housed in a ceramic cylinder as an insulated vessel, and plural gate terminals. Plural through-holes are formed in the ceramic cylinder. Leads connected to gate terminals pass through their respective through-holes. The leads are connected to internal gate terminals (electrodes). Each internal gate terminal is provided for each lead and connected electrically to a gate electrode of the semiconductor element.

12 Claims, 10 Drawing Sheets

PRIOR ART

PRIOR ART

INSULATED HIGH SPEED SEMICONDUCTOR SWITCHING DEVICE

BACKGROUND OF THE INVENTION

1. Field of the Invention

The present invention relates to a semiconductor device having a semiconductor element housed in an insulated vessel and external terminals for controlling potentials of electrodes of the semiconductor element, and particularly to a gate commuted semiconductor device in which a main current is commuted upon turning-off thereof.

2. Related Art

A GCT thyristor, in a semiconductor device, has been available as a gate commuted turn-off semiconductor element capable of commuting all of a main current to the gate side on turning-off thereof. Generally, the GCT thyristor is connected to a gate drive unit which is a circuit for driving the gate thereof with wires to be used as a GCT unit.

In FIGS. 8A and 8B, there is shown a construction of a conventional GCT thyristor. The GCT thyristor, as shown in the figures, is configured such that a semiconductor substrate 3 is disposed between an anode post electrode 1 and a cathode post electrode 2 via buffer members 5 having conductivity. The semiconductor substrate 3 sandwiched between the anode post electrode 1 and the cathode post electrode 2 is housed in an insulative ceramic cylinder 4. A flange 16 and a cathode cap 18 are disposed at respective openings of the ceramic cylinder 4. The cathode cap 18 serves as a member for connecting a cathode terminal base of a gate drive unit board with the cathode electrode of the GCT thyristor. On the semiconductor substrate 3, formed is a semiconductor element that has a gate electrode and is controlled by a gate signal applied to the gate electrode to commutate all of a main current to the gate side on turning-off thereof.

FIG. 9 is a view showing a ring gate 31a and a lead 31b of the conventional GCT thyristor. A gate signal is transmitted to the semiconductor substrate 3 from outside through the ring gate 31a and the lead line 31b. The conventional GCT thyristor has a through-hole formed in the ceramic cylinder 4 through which the lead 31b passes to outside of the cylinder 4.

For the GCT thyristor, when an inductance of a wiring connecting the GCT thyristor with the gate drive unit is large, quick commutation on turning-off would be hindered and cause break-down due to local heat generated within the semiconductor substrate. In such a case, there arises problems of increase in control current and reduction of a high speed switching operation.

For the construction shown in FIG. 9, it is sufficient to provide plural leads to reduce a wiring inductance. However, By simply attaching plural leads 31b to one ring gate 31a, the plural leads would be an obstacle to house the ring gate 31a within the ceramic cylinder 4 in an assembly process.

A construction shown in FIG. 10 has been contrived as an example of a GCT thyristor capable of reducing a wiring inductance. The GCT thyristor shown in the figure uses a gate ring 8 as shown in FIG. 11 that has plural gate terminals formed in a radial pattern around the center of a semiconductor element. Such the shape allows the inductance to be reduced, and a rising rate (diGQ/dt) of a gate reverse current to be increased largely on the turning-off, thereby enabling quick commutation on the turning-off. Thus an increase of a control current and a high speed switching operation can be achieved.

In FIG. 10, an anode fin 10 is disposed on the outer side of the anode post electrode 1, a cathode fin 11 is disposed on the outer side of the cathode cap 18. These are coupled each other by pressing with force. A gate ring 8 is sandwiched between two separate ceramic cylinders 4a and 4b, and fixedly attached to these cylinders 4a and 4b by silver soldering to be supported so as to ensure insulation between the gate and the cathode. Furthermore, the gate ring 8 is crimped to a ring gate 6 which is a gate electrode by an elastic member 7 such as a spring. In a prior art practice, the inductance is reduced in the above construction.

However, using the two separate ceramic cylinders 4a and 4b as described above results in complexity of processing of the ceramics, and increase of the number of components which then causes difficulty of maintaining accuracy of components, thereby causing higher cost of the components.

SUMMARY OF THE INVENTION

The present invention has been made to solve the above problem and it is an object of the present invention to provide a semiconductor device having a semiconductor element housed in an insulated vessel and external terminals for controlling potentials of electrodes of the semiconductor element, that can increase a control current and achieve a high speed switching operation as well as decreasing the costs of components thereof.

A semiconductor device according to the invention, includes a semiconductor element having a gate electrode to which a main current is commuted when the semiconductor element turns off, the semiconductor element being housed in an insulated vessel. The gate commuted semiconductor device includes plural external terminals that are coupled to the gate electrode of the semiconductor element, plural through-holes that are formed in the insulated vessel, and plural leads each passing through the respective through-holes and connected to their respective external terminals. Each lead has its own terminal (electrode) for electrically connecting with the gate electrode. The leads are disposed with an equal pitch.

According to such a semiconductor device, plural external terminals are connected to the gate electrode, and thus a wiring impedance can be reduced. Therefore increase of control current and a high speed switching operation can be achieved. Furthermore, no necessity arises for complex processing for the insulated vessel and the number of constituents associated therewith decreases, thereby enabling reduction in fabrication cost.

In the above semiconductor device, the terminal of the lead may have discoidal shape, and then the terminals of the leads may preferably be stacked to be connected to the gate electrode of the semiconductor element. By using such the terminals to acquire electric connection with the semiconductor element, an effective electrode area can be sufficiently secured for supplying a gate signal from the central section of the semiconductor element.

In the above semiconductor device, the terminal of the lead may have ringed shape, and then the terminals of the leads may preferably be stacked to be connected to the gate electrode of the semiconductor element. By using such the terminals to acquire electric connection with the semiconductor element, supply of a gate signal can be possible from the peripheral section of the semiconductor element.

In the above semiconductor device, the terminal of the lead may have deltaic shape, and then the terminals of the leads may preferably be juxtaposed to be connected to the gate electrode of the semiconductor element. By using such the terminals juxtaposed, a gate signal is supplied almost uniformly to the gate electrode, thereby enabling a more efficient commuting operation to be realized than in a case where the terminals are stacked in use.

In the above semiconductor device, the terminal of the lead may have approximately U-shape, and then the terminals of the leads may preferably be juxtaposed to be connected to the gate electrode of the semiconductor element. By using such the terminals juxtaposed, a gate signal is supplied almost uniformly to the gate electrode when the gate signal is supplied from the peripheral section of the semiconductor element, thereby enabling a more efficient commuting operation to be realized than in a case where the terminals are stacked in use.

In the above semiconductor device, some of all terminals of the leads may have discoidal shape, and the others thereof may have ringed shape. The terminals with discoidal shape may be stacked and connected to the gate electrode of the semiconductor element in the vicinity of a central section of the gate electrode, and the terminals with ringed shape may be stacked and connected to the gate electrode of the semiconductor element in a peripheral section of the gate electrode. The leads of terminals with ringed shape and the leads of terminals with discoidal shape may be disposed with an equal pitch, respectively. With such a configuration, supply of a gate signal can be made from the central and peripheral sections of the semiconductor element in two ways, thereby enabling realization of more uniform commuting operation and a high reliability semiconductor device.

In the above semiconductor device, some of all terminals of the leads may have detaic shape, and the others thereof may have ringed shape. The terminals with deltaic shape may be juxtaposed and connected to the gate electrode of the semiconductor element in the vicinity of a central section of the gate electrode, and the terminals with ringed shape may be stacked and connected to the gate electrode of the semiconductor element in a peripheral section of the gate electrode. The leads of juxtaposed terminals may be disposed with an equal pitch, and the leads of stacked terminals may be disposed with an equal pitch. With such a configuration, supply of a gate signal can be made from the central and peripheral sections of the semiconductor element in two ways; therefore the gate signal is transmitted more uniformly to the semiconductor element in the central section thereof, thereby enabling realization of a semiconductor device with high reliability.

In the above semiconductor device, some of all terminals of the leads may have discoidal shape, and the others thereof may have approximately U shape. The terminals with discoidal shape may be stacked and connected to the gate electrode of the semiconductor element in the vicinity of a central section of the gate electrode. The terminals with approximately U shape may be juxtaposed and connected to the gate electrode of the semiconductor element in a peripheral section of the gate electrode. The leads of juxtaposed terminals may be disposed with an equal pitch, and the leads of stacked terminals may be disposed with an equal pitch. With such a configuration, supply of a gate signal can be made from the central and peripheral sections of the semiconductor element in two ways; therefore the gate signal is transmitted more uniformly to the semiconductor element in the peripheral section, thereby enabling realization of a semiconductor device with high reliability.

In the above semiconductor device, some of all terminals of the leads may have deltaic shape, and the others thereof may have approximately U shape. The terminals with deltaic shape may be juxtaposed and connected to the gate electrode of the semiconductor element in the vicinity of a central section of the gate electrode, and the terminals with approximately U shape may be juxtaposed and connected to the gate electrode of the semiconductor element in a peripheral section of the gate electrode. The leads of juxtaposed terminals may be disposed with an equal pitch. With such a configuration, supply of a gate signal can be made from the central and peripheral sections of the semiconductor element in two ways; therefore the gate signal is transmitted more uniformly to the semiconductor element in the central and peripheral sections, thereby enabling realization of the semiconductor element with high reliability.

In the above semiconductor device, a flexible portion may be provided at a connection section between the lead and the terminal. Thus, a thermal stress generated during a temperature rise is absorbed, thereby enabling a semiconductor device with high reliability to be formed.

The lead may have a flat portion, and thus a surface area can increase and a wiring inductance of a lead line can be reduced.

Non-bright plating can be preferably applied on a terminal of a lead line. Thereby, reduction can be realized in a contact resistance between the electrodes of gate lead lines.

DESCRIPTION OF THE PREFERRED EMBODIMENTS

Description will be detailed of embodiments of a semiconductor device relating to the present invention below with reference to the accompanying drawings. A semiconductor device according to the present invention as described below is a gate commuted turn-off semiconductor element (GCT element) capable of commuting all of a main current to a gate side when the semiconductor element turns-off. The semiconductor device is connected by wiring to a gate drive unit which is a circuit for driving a gate of the device, and then is integrated into one to be used as a GCT unit.

<First Embodiment>

Figure 1A:
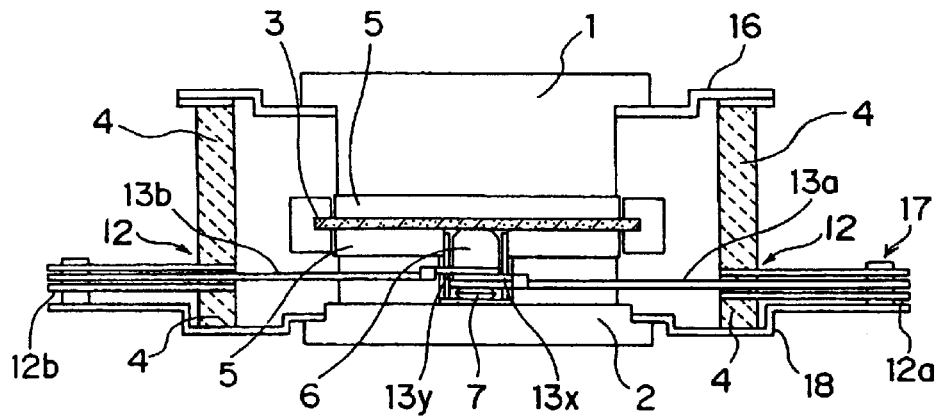
FIG. 1A is a cross-sectional view of a semiconductor device (GCT element) according to a first embodiment of the present invention.
Figure 1B:
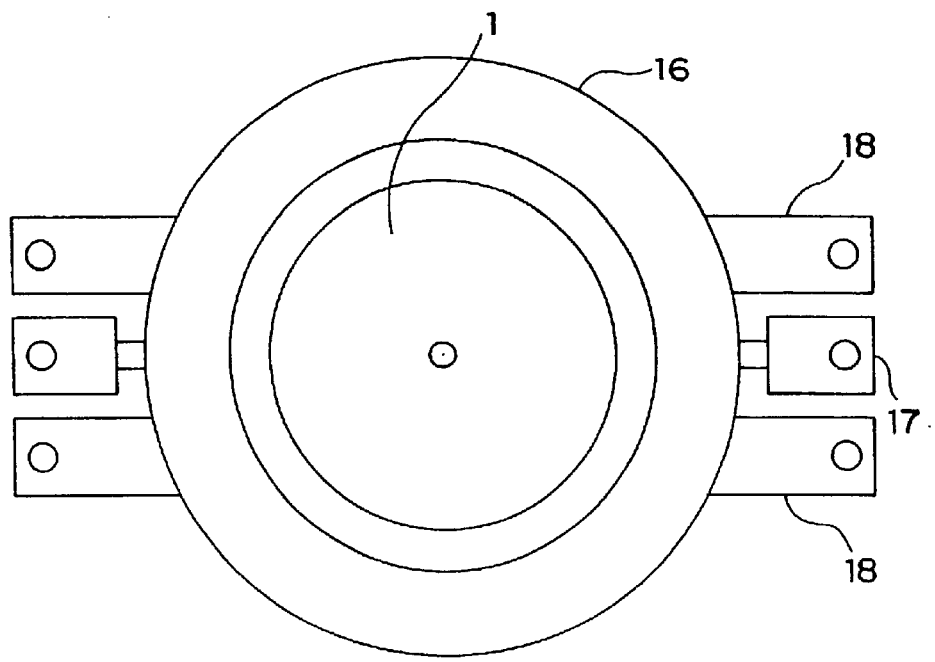
FIG. 1B is a top view thereof.

FIGS. 1A and 1B show a semiconductor device according to a first embodiment of the invention. FIG. 1A is a cross-sectional view of the semiconductor device and FIG. 1B is a top view thereof. The semiconductor device of this embodiment has two gate terminals (external terminals) 17. The semiconductor device has a construction in which a semiconductor substrate 3 is disposed between an anode post electrode 1 and a cathode post electrode 2 via buffer members 5 made of conductive material such as tungsten. The semiconductor substrate 3 is housed in a ceramic cylinder 4 which is an insulated vessel, together with the anode post electrode 1 and the cathode post electrode 2. A flange 16 and a cathode cap 18 are disposed at respective openings of the ceramic cylinder 4. They are both coupled to the ceramic cylinder 4 by pressing with force, together with the anode post electrode 1 and the cathode post electrode 2. The semiconductor substrate 3 has an anode electrode, a cathode electrode and a gate electrode. On the substrate 3, there is formed a semiconductor element that can be controlled by a gate signal applied to the gate electrode, and commute all of a main current to the gate side upon turning-off thereof.

Two through-holes are formed in the ceramic cylinder 4 in correspondence to the number of the gate terminals, and gate pipes 12a and 12b are inserted into the respective through-holes. The gate pipes 12a and 12b are fixed by silver soldering together with other metal components. In the pipes 12a and 12b, there are inserted gate leads 13a and 13b for transmitting gate signals from the respective gate terminals to the gate electrode of the semiconductor substrate 3. One ends of the respective gate leads 13a and 13b are coupled to the gate terminals 17.

The gate leads 13a and 13b are connected to respective internal gate terminals 13x and 13y which are disk-shaped (discoidal) thin plate electrodes by silver soldering at the other ends thereof opposed to the one ends which are connected to the gate terminals 17. The internal gate terminals 13x and 13y may also be connected to the gate leads 13a and 13b by pressing with force other than silver soldering. The gate leads are preferably of flexibility.

The semiconductor device shown in FIG. 1 has a construction in which gate wiring is led out from the central section of the semiconductor substrate 3. Therefore, a gate electrode 6 is disposed so as to be electrically connected to the central section (gate electrode) of the semiconductor substrate 3. The internal gate terminals 13x and 13y of the gate leads 13a and 13b are stacked and urged to contact to the gate electrode 6 by an elastic member 7 such as a spring. Thereby, electrical connection is established between the gate electrode of the semiconductor substrate 3 and the gate leads 13a and 13b. Note that in a case where N (N≧2) gate terminals are to be provided, N disk-shaped electrodes are stacked. At this time, the gate leads are preferably disposed with an equal pitch.

The semiconductor device configured as above, has plural gate leads provided in correspondence to gate terminals, and thus can reduce a wiring inductance in a gate section, thereby enabling a high speed switching operation to be realized.

Further, the through-holes are provided in the ceramic cylinder 4 and the gate leads 13a and 13b pass through the holes, and thus it does not need to divide the ceramic cylinder, thereby eliminating problems relating to increase in the number of components, and complexity in processing.

In a semiconductor device of this embodiment, the internal gate terminals 13x and 13y of the gate leads 13a and 13b are provided to respective leads corresponding to the gate terminals. Thus, in a fabrication process of the semiconductor device, the leads can be housed individually into the vessel. Therefore, even in a case where many gate leads to be housed are required when plural gate terminals are provided, each gate lead can easily be housed into the vessel.

Figure 2A:
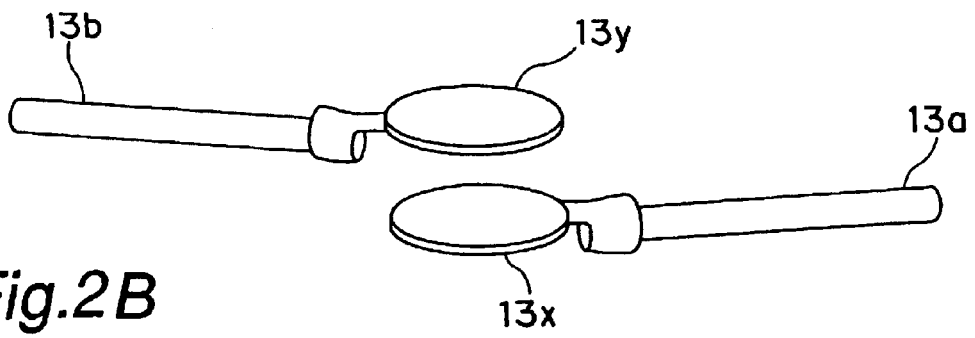
FIGS. 2A, 2B and 2C are views showing gate leads and terminals or electrodes thereof.
Figure 2B:
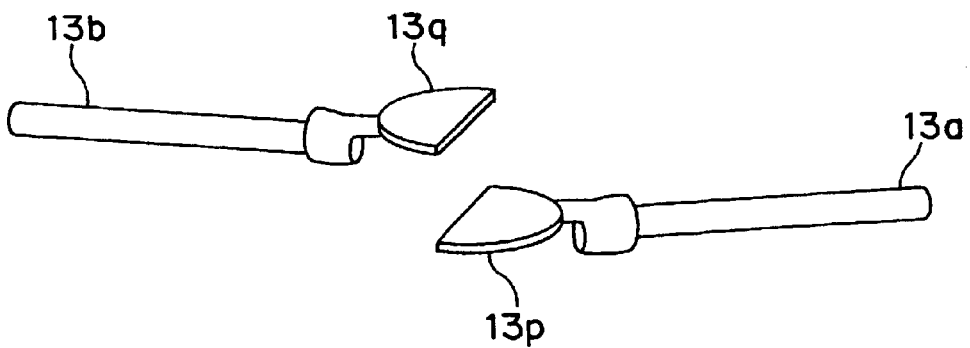
Figure 2C:
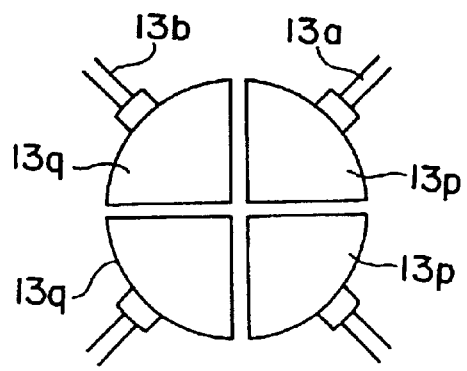

FIG. 2B shows another shape of an internal gate terminal of this embodiment. In this embodiment, since the two gate terminals 17 are provided, the another shape is obtained by dividing in half a disk as shown in FIG. 2A, that is, a semicircle. In this case, internal gate terminals 13p and 13q are juxtaposed so that those terminals 13p and 13q are combined to form a discoidal terminal, and then the gate electrode 6 is disposed over the juxtaposed terminals 13p and 13q to obtain electrical connection to the gate electrode of the semiconductor substrate 3. Thus, it does not need to stack the two electrodes and gate signals from the leads 13a and 13b are supplied substantially uniformly to the gate electrode 6, thereby enabling a commuting operation to be more efficiently realized than in the case of FIG. 2A. It is noted that in a case where N (N≧2) gate terminals are provided, a shape of the internal gate terminal may preferably be a shape obtained by dividing uniformly a disk shaped electrode as shown in FIG. 2A into N pieces each with the same shape as shown in FIGS. 2B and 2C (That shape is referred to as "deltaic shape".). The gate leads are preferably disposed with an equal pitch.

By disposing the gate electrode at the central section of the semiconductor substrate as in this embodiment, an effective electrode area can be secured more in the semiconductor substrate.

<Second Embodiment>

Figure 3A:
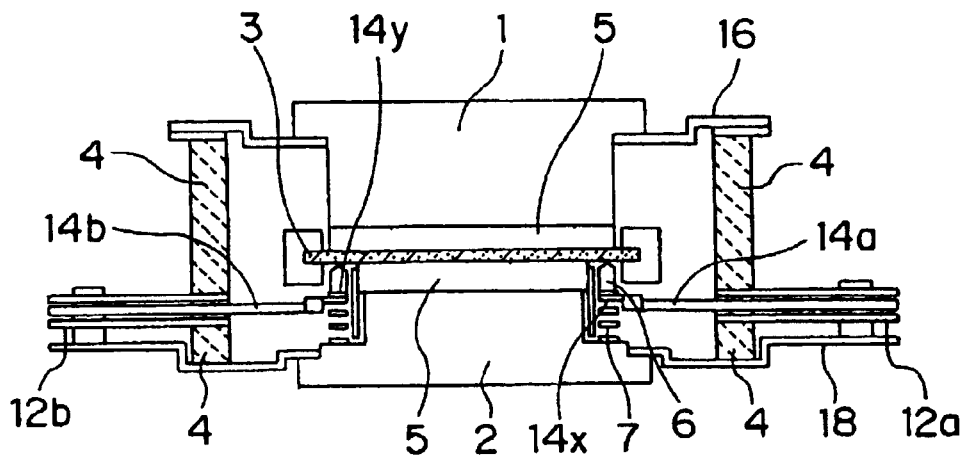
FIG. 3A is a cross-sectional view of a semiconductor device (GCT element) according to a second embodiment of the present invention.
Figure 3B:
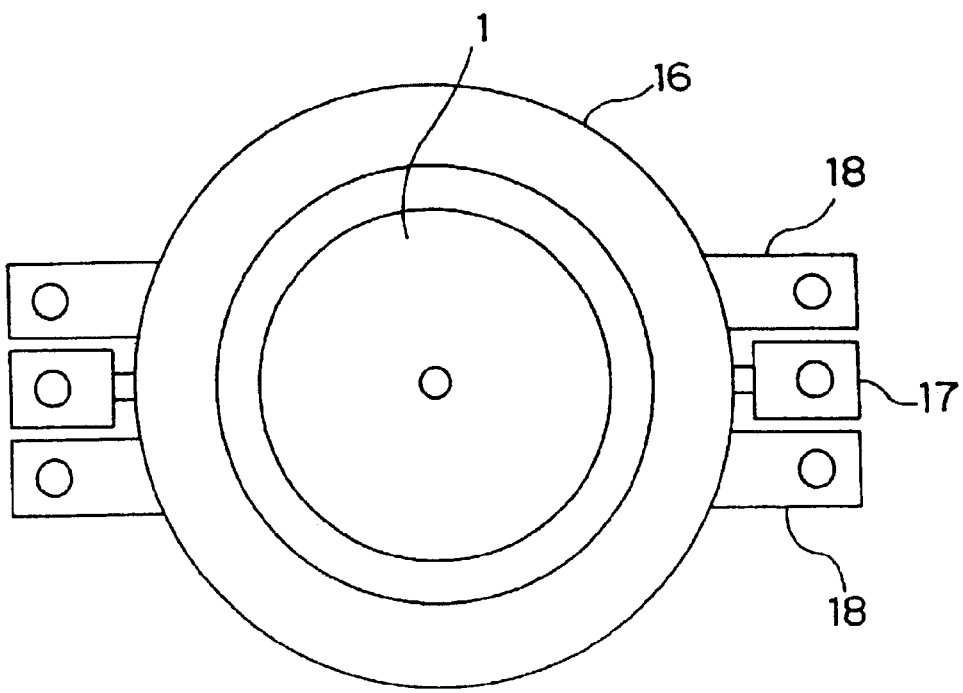
FIG. 3B is a top view thereof.

FIGS. 3A and 3B show a construction of a semiconductor device according to a second embodiment of the invention. FIG. 3A is a cross-sectional view of the semiconductor device, and FIG. 3B is a top view thereof. In this embodiment, a construction for leading out gate wiring from the peripheral section of the semiconductor substrate 3.

Figure 4A:
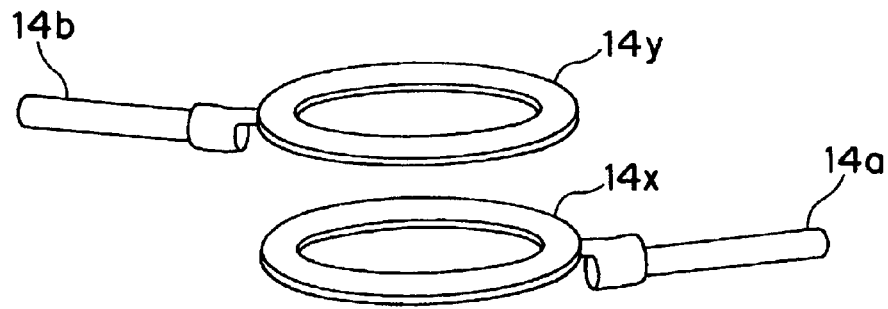
FIGS. 4A, 4B and 4C are views showing gate leads and terminals or electrodes thereof.

As shown in FIG. 3A, the gate electrode 6 in the semiconductor device is connected to the peripheral section of the semiconductor substrate 3. The gate electrode 6 has ringed shape. Internal gate terminals 14x and 14y which are electrodes of gate leads 14a and 14b, are urged to contact to the gate electrode 6 by the elastic member 7. The internal gate terminals 14x and 14y of the gate leads 14a and 14b have each ringed shape as shown in FIG. 4A. The other parts of the construction are the same as the corresponding parts in the first embodiment.

According to this embodiment, gate wiring can be led out from the peripheral section of the semiconductor substrate. By leading out the gate wiring from the peripheral section in such a way, lengths of the leads 14a and 14b can be shorter, thereby reducing a wiring inductance.

Figure 4B:
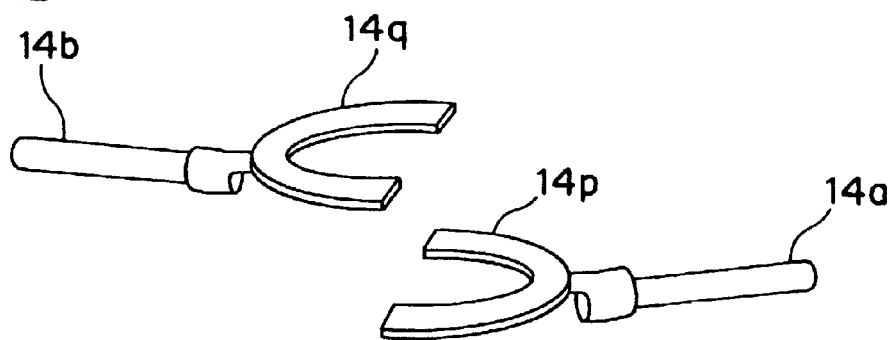
Figure 4C:
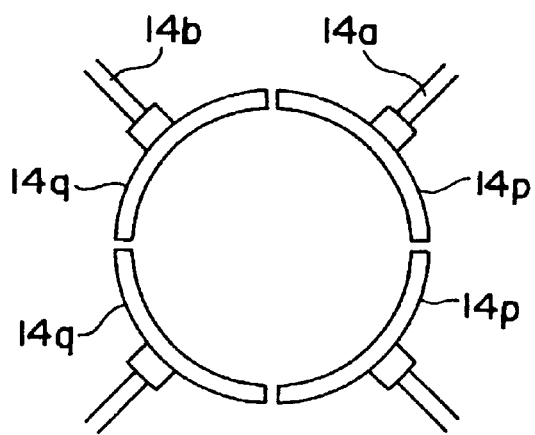

FIG. 4B shows another shape of an internal gate terminal in this embodiment. As shown in the figure, the internal gate terminals 14p and 14q may be approximately U-shape obtained by dividing in half the internal gate terminal 14x or 14y with ringed shape. In this case, the internal gate terminals 14p and 14q are juxtaposed to form a terminal ring in combination, and the gate electrode 6 is disposed thereon to acquire electrical connection to the gate electrode of the semiconductor substrate 3. Since no necessity arises for stacking electrodes as in the case of FIG. 4A, gate signals from the leads 14a and 14b is supplied substantially uniformly supplied to the gate electrode 6, thereby resulting in a more efficient commuting operation. Especially, this is more effective when the number of leads is increased. It is noted that in a case where N (N≧2) gate terminals are provided, a shape of the internal gate terminal may be approximately U-shaped as shown in FIGS. 4B and 4C, which is obtained by dividing uniformly a terminal ring shown in FIG. 4A into N pieces each with the same shape.

<Third Embodiment>

Figure 5:
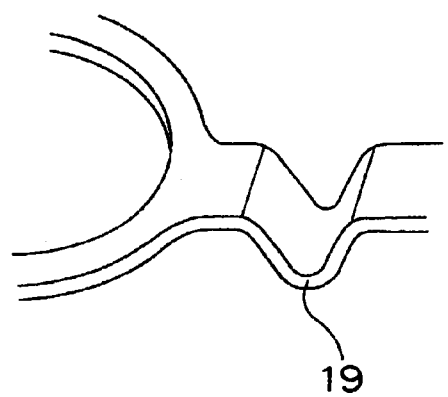
FIG. 5 is a view showing a gate lead having a bend portion (a third embodiment)

FIG. 5 shows a preferable shape of a gate lead. In this embodiment, a bend portion 19 is provided at a connection section between the gate lead 13a, 13b . . . , and the corresponding internal gate terminal 13p, 13q . . . . This allows the lead 13a, 13b . . . to be flexible and to absorb a thermal stress generating during temperature rise due to a current flowing through the gate section, thereby resulting in a high reliability semiconductor element. In a case where the gate electrode is located at the central section of a semiconductor substrate, leads become inevitably longer and are easily heated up to a high temperature, and it could cause metal fatigue due to temperature cycles. The construction shown in FIG. 5 is especially effective to such the case.

<Fourth Embodiment>

Figure 6:
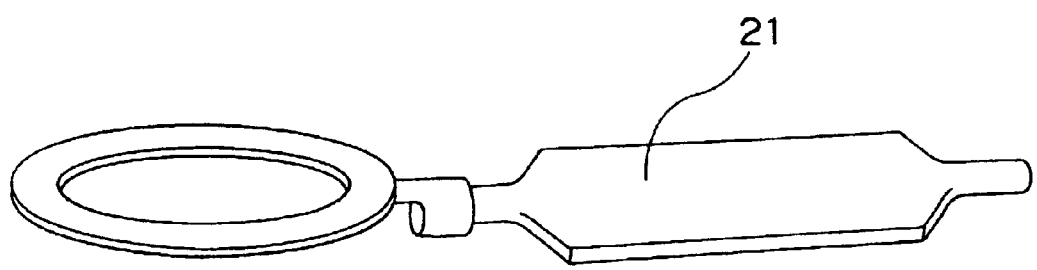
FIG. 6 is a view showing a gate lead having a flat shaped portion (a fourth embodiment)

FIG. 6 shows the other preferred shape of a gate lead. A lead of this embodiment as shown in the figure has a flat shaped portion 21 as at least one part thereof. By providing the flat shaped portion 21 in such a way, a surface area increases and more of a wiring inductance of gate leads can be reduced.

<Fifth Embodiment>

Figure 7A:
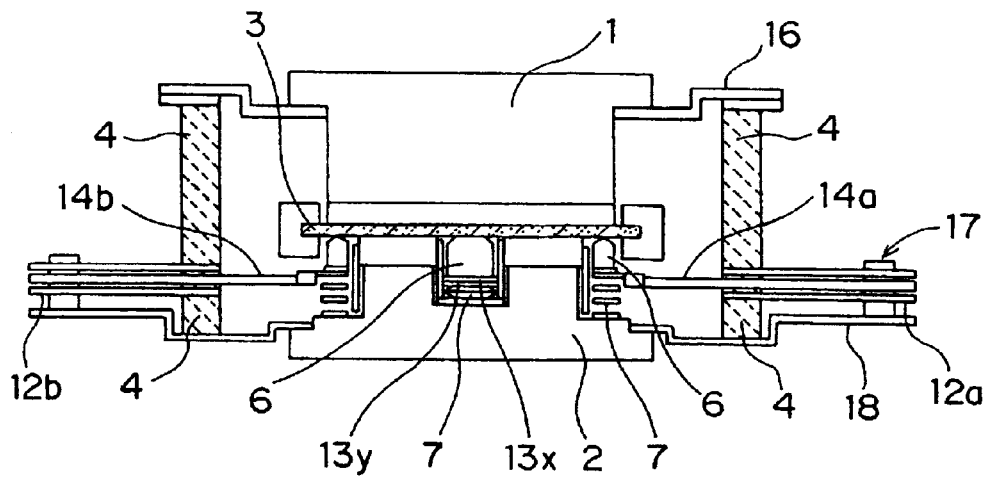
FIG. 7A is a cross-sectional view of a semiconductor device (GCT element) according to a fifth embodiment of the present invention.
Figure 7B:
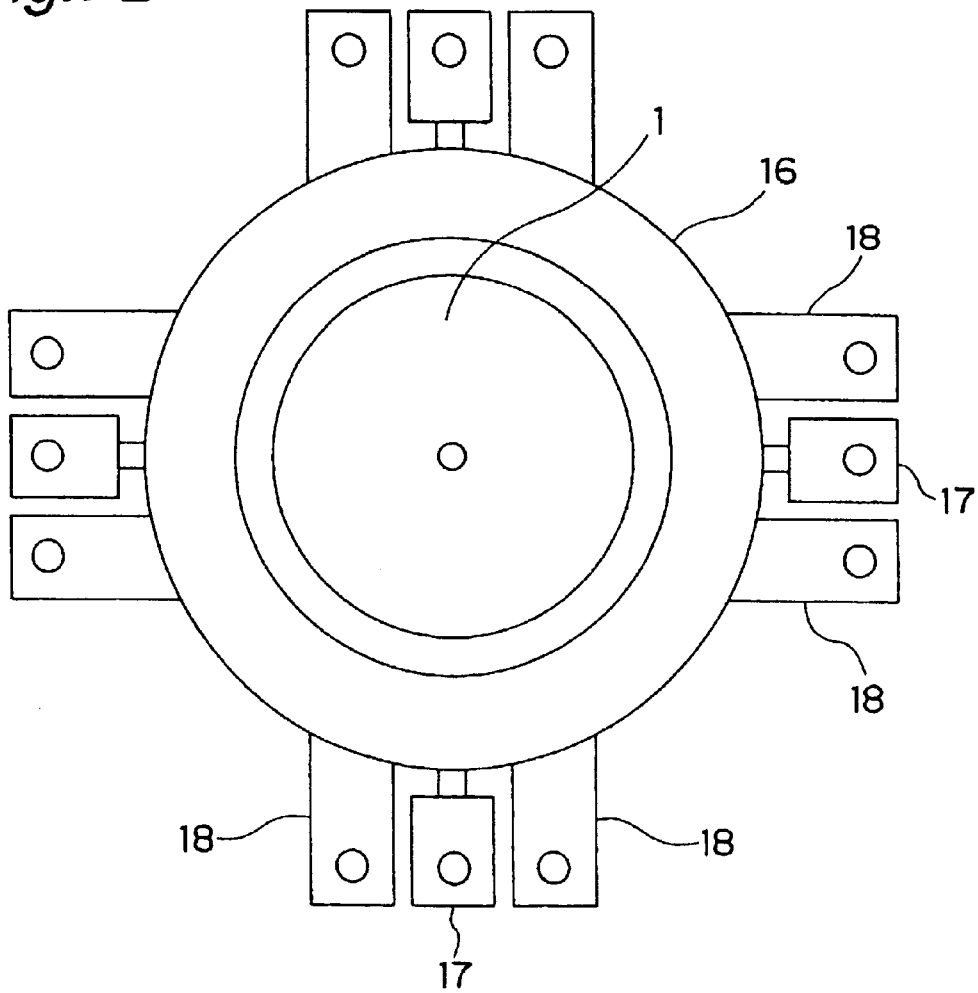
FIG. 7B is a top view thereof.
Figure 8A:
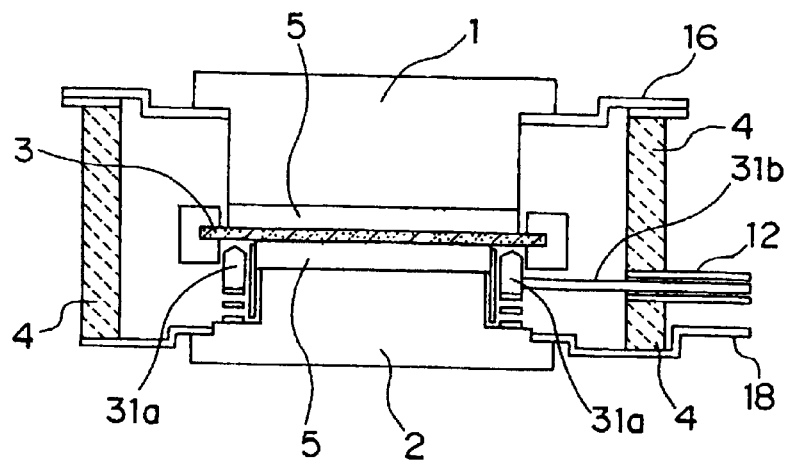
FIG. 8A is a cross-sectional view of a conventional semiconductor device (GCT element)
Figure 8B:
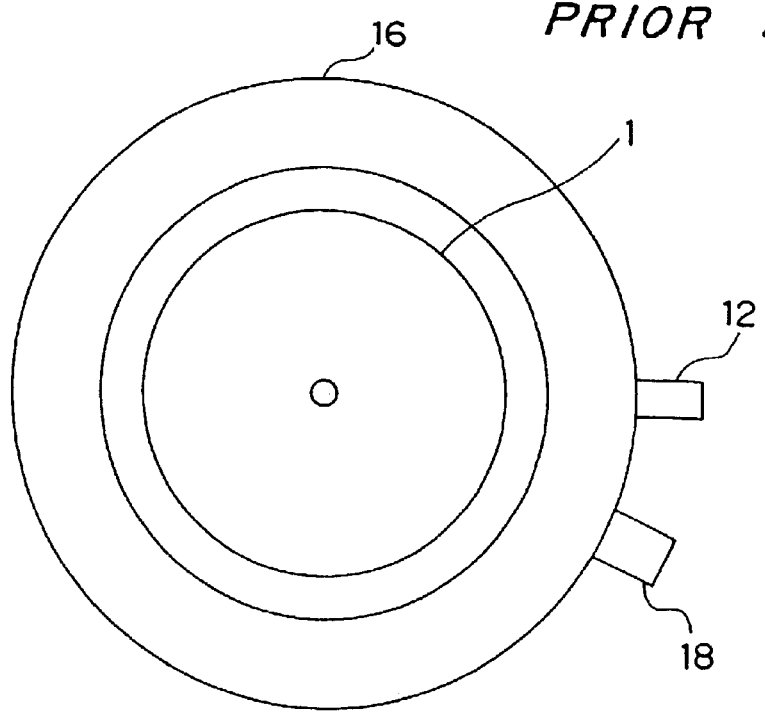
FIG. 8B is a top view thereof.
Figure 9:
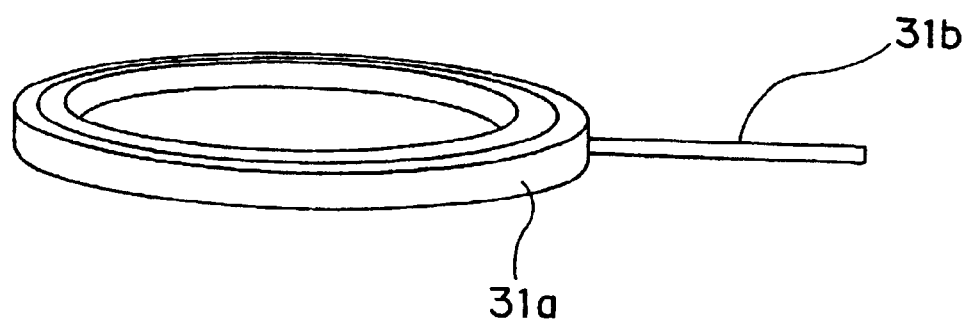
FIG. 9 is a view showing a conventional gate lead and an electrode thereof.
Figure 10A:
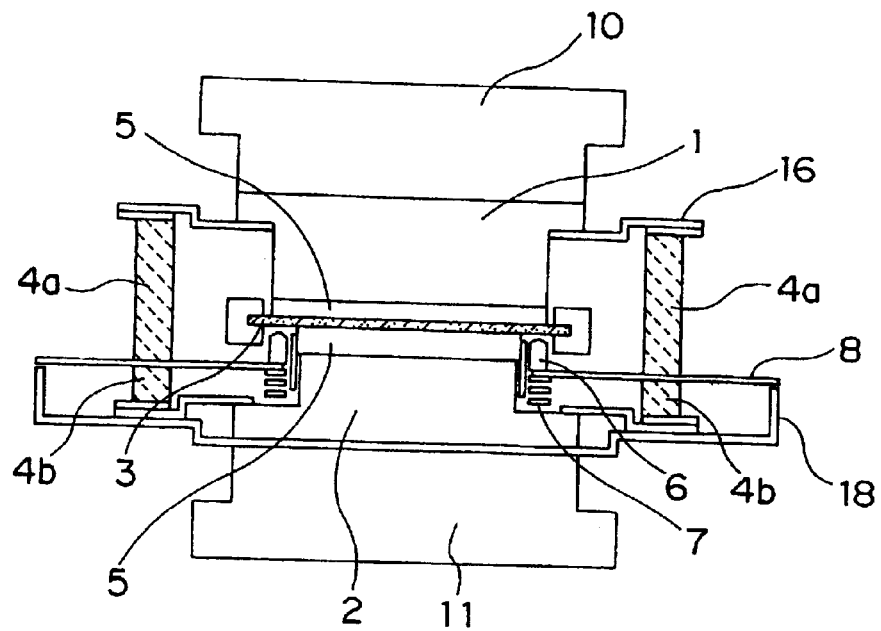
FIG. 10A is a cross-sectional view of a conventional semiconductor device (GCT element)
Figure 10B:
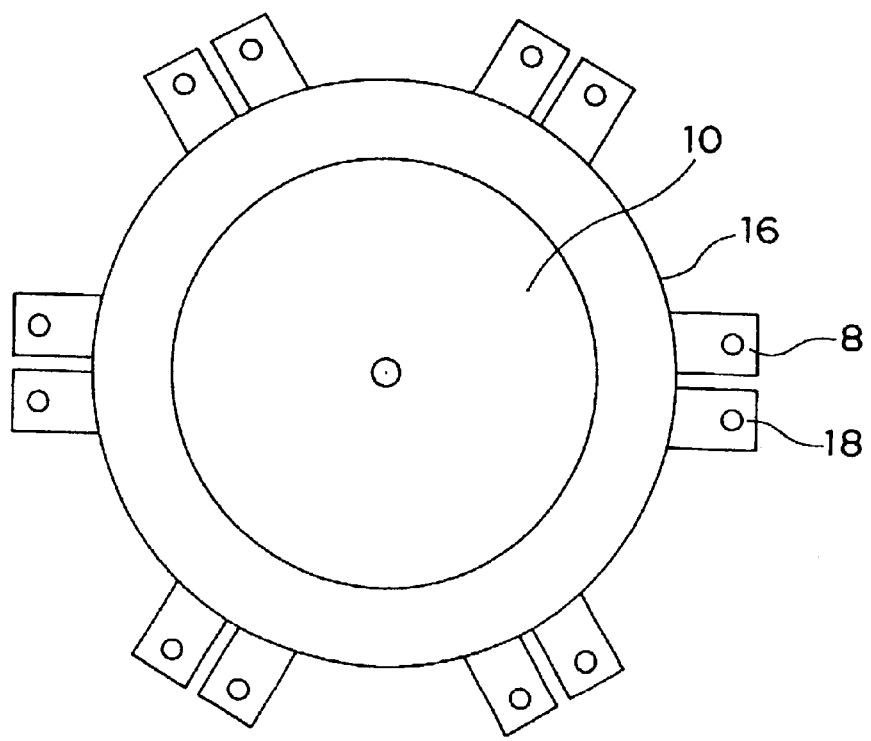
FIG. 10B is a top view thereof.
Figure 11:
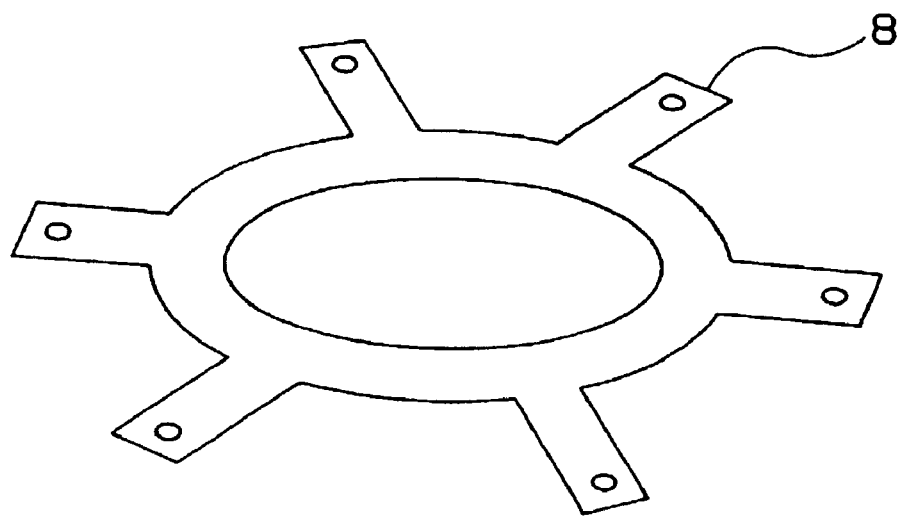
FIG. 11 is a view showing a conventional gate electrode.

FIG. 7 shows a construction of a semiconductor device according to a fifth embodiment of the invention. A semiconductor device of this embodiment is capable of transmitting a gate signal to both the central section and the peripheral section of the semiconductor device 3.

In the example shown in FIG. 7, in the semiconductor device, the electrode structure shown in the first embodiment is adopted in the central section of the semiconductor substrate 3, and the electrode structure shown in the second embodiment is adopted in the peripheral section of the semiconductor substrate 3. The electrode structures shown in the above embodiments can be used in various ways of combination as an electrode structure in the central and peripheral sections of the semiconductor substrate 3.

When a commutation signal is received from gate terminals, a portion spaced far away from the gate electrode would locally generate heat to break down under influence of a main current. According to the construction of this embodiment, a gate signal (commutation signal) can be supplied from both the central and peripheral sections of the semiconductor substrate, and therefore a more uniform commuting operation can be performed. This provides a GCT element capable of treating a large current and with a high reliability.

In the above embodiments, non-bright (soft) plating may be applied to the internal gate terminals 13x, 13y, 13p, 13q, 14x, 14y, 14p and 14q of the gate leads. Thus, contact resistance between the internal gate terminals can be reduced. Furthermore, the leads connected to corresponding internal gate terminals are preferably disposed with an equal pitch in the central and peripheral sections of the semiconductor substrate 3.

According to a semiconductor device of the present invention, plural external terminals connected to the gate electrode of a semiconductor element can be provided in order to reduce a wiring inductance, increase a control current and achieve a high speed switching operation. Furthermore, it does not need to apply complex processing to the insulated vessel, the number of constituents can be decreased, thereby resulting in reduction in fabrication cost.

Although the present invention has been described in connection with specified embodiments thereof, many other modifications, corrections and applications are apparent to those skilled in the art. Therefore, the present invention is not limited by the disclosure provided herein but limited only to the scope of the appended claims.

The present disclosure relates to subject matter contained in Japanese Patent Application No. 2002-91507, filed on May 28, 2002, which is expressly incorporated herein by reference in its entirety.

What is claimed is:

1. A gate commuted semiconductor device which includes a semiconductor element having a gate electrode to which a main current is commuted when the semiconductor element turns off, the semiconductor element being housed in an insulated vessel, the gate commuted semiconductor device comprising:

plural external terminals that are coupled to the gate electrode of the semiconductor element;

plural through-holes that are formed in the insulated vessel; and plural leads each passing through the respective through-holes and connected to their respective external terminals, each lead having its own terminal for electrically connecting with the gate electrode, the leads being disposed with an equal pitch.

2. The semiconductor device according to claim 1, wherein the terminal of the lead has discoidal shape, and the terminals of the leads are stacked to be connected to the gate electrode of the semiconductor element.

3. The semiconductor device according to claim 1, wherein the terminal of the lead has ringed shape, and the terminals of the leads are stacked to be connected to the gate electrode of the semiconductor element.

4. The semiconductor device according to claim 1, wherein the terminal of the lead has deltaic shape, and the terminals of the leads are juxtaposed to be connected to the gate electrode of the semiconductor element.

5. The semiconductor device according to claim 1, wherein the terminal of the lead has approximately U-shape, and the terminals of the leads are juxtaposed to be connected to the gate electrode of the semiconductor element.

6. The semiconductor device according to claim 1, wherein some of all terminals of the leads have discoidal shape, the others thereof have ringed shape, the terminals with discoidal shape are stacked and connected to the gate electrode of the semiconductor element in the vicinity of a central section of the gate electrode, the terminals with ringed shape are stacked and connected to the gate electrode of the semiconductor element in a peripheral section of the gate electrode, and the leads of terminals with ringed shape and the leads of terminals with discoidal shape are disposed with an equal pitch, respectively.

7. The semiconductor device according to claim 1, wherein:

some of all terminals of the leads have detaic shape, the others thereof have ringed shape, the terminals with deltaic shape are juxtaposed and connected to the gate electrode of the semiconductor element in the vicinity of a central section of the gate electrode, the terminals with ringed shape are stacked and connected to the gate electrode of the semiconductor element in a peripheral section of the gate electrode, the leads of juxtaposed terminals are disposed with an equal pitch, and the leads of stacked terminals are disposed with an equal pitch.

8. The semiconductor device according to claim 1, wherein:

some of all terminals of the leads have discoidal shape, the others thereof have approximately U shape, the terminals with discoidal shape are stacked and connected to the gate electrode of the semiconductor element in the vicinity of a central section of the gate electrode, the terminals with approximately U shape are juxtaposed and connected to the gate electrode of the semiconductor element in a peripheral section of the gate electrode, and the leads of juxtaposed terminals are disposed with an equal pitch, and the leads of stacked terminals are disposed with an equal pitch.

9. The semiconductor device according to claim 1, wherein:

some of all terminals of the leads have deltaic shape, the others thereof have approximately U shape, the terminals with deltaic shape are juxtaposed and connected to the gate electrode of the semiconductor element in the vicinity of a central section of the gate electrode, the terminals with approximately U shape are juxtaposed and connected to the gate electrode of the semiconductor element in a peripheral section of the gate electrode, and the leads of juxtaposed terminals are disposed with an equal pitch.

10. The semiconductor device according to claim 1, wherein a flexible portion is provided at a connection section between the lead and the terminal.

11. The semiconductor device according to claim 1, wherein the lead has a flat portion.

12. The semiconductor device according to claim 1, wherein non-bright plating is applied on the terminal of the lead.

* * * * *